(12) United States Patent
Chen et al.

(10) Patent No.: US 8,026,562 B2
(45) Date of Patent: Sep. 27, 2011

(54) MAGNETIC MEMORY ELEMENT UTILIZING SPIN TRANSFER SWITCHING

(75) Inventors: Wei-Chuan Chen, Taipel County (TW); Cheng-Tyng Yen, Kaohsiung (TW); Ding-Yeong Wang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/883,188

(22) Filed: Sep. 16, 2010

(65) Prior Publication Data

US 2011/0001203 A1 Jan. 6, 2011

Related U.S. Application Data

(62) Division of application No. 12/398,181, filed on Mar. 5, 2009, now Pat. No. 7,829,964.

(30) Foreign Application Priority Data

Oct. 31, 2008 (TW) .............................. 97142204 A

(51) Int. Cl.
*H01L 29/82* (2006.01)
(52) U.S. Cl. ................................ 257/421; 257/E29.323

(58) Field of Classification Search .................. 257/421, 257/E29.323
See application file for complete search history.

(56) References Cited

U.S. PATENT DOCUMENTS

| 6,927,466 | B2 | 8/2005 | Drewes | |
|---|---|---|---|---|
| 7,088,609 | B2 | 8/2006 | Valet | |
| 7,266,012 | B2 | 9/2007 | Saito et al. | |
| 2007/0002504 | A1* | 1/2007 | Huai et al. | 360/324.12 |
| 2007/0085068 | A1* | 4/2007 | Apalkov et al. | 257/1 |
| 2008/0291721 | A1* | 11/2008 | Apalkov et al. | 365/173 |
| 2010/0072524 | A1* | 3/2010 | Huai et al. | 257/295 |
| 2010/0084725 | A1* | 4/2010 | Zhu et al. | 257/421 |
| 2010/0128520 | A1* | 5/2010 | Zheng et al. | 365/171 |

OTHER PUBLICATIONS

"Office Action of Taiwan Counterpart Application", issued on Jan. 20, 2011, p1-p6, in which the listed references were cited.

* cited by examiner

*Primary Examiner* — Trung Q Dang
(74) *Attorney, Agent, or Firm* — Jianq Chyun IP Office

(57) ABSTRACT

A magnetic memory element includes a pinned layer, a tunneling barrier layer, a free layer and a stabilizing layer. The tunneling barrier layer is disposed on the pinned layer. The free layer is disposed on the tunneling barrier layer. The stabilizing layer is disposed on the free layer.

12 Claims, 8 Drawing Sheets

400

MAGNETIC MEMORY ELEMENT UTILIZING SPIN TRANSFER SWITCHING

CROSS-REFERENCE TO RELATED APPLICATION

This application is a divisional application of and claims the priority benefit of an application Ser. No. 12/398,181, filed on Mar. 5, 2009, which claims the priority benefit of Taiwan application serial no. 97142204, filed on Oct. 31, 2008. The entirety of each of the above-mentioned patent applications is hereby incorporated by reference herein and made a part of this specification.

BACKGROUND

1. Technical Field

The disclosure is related to a magnetic memory element, and in particular to a magnetic memory element utilizing spin transfer switching.

2. Description of Related Art

The magnetic random access memory (MRAM) has the advantages such as non-volatility, high density, high reading and writing speeds, and radiation resistance. When the conventional magnetic memory writes data, generally a magnetic memory cell selected by the intersection of induction magnetic fields of a write bit line (BL) and a write word line (WWL) is used to change a magnetoresistance (MR) of the magnetic memory by changing a magnetized vector direction of the free layer. When reading a memory data, a reading current flows into the selected magnetic memory cell. Afterwards, a detected resistance of the magnetic memory cell is used to determine a digital value of the memory data.

A conventional magnetic memory cell is a stacked structure formed by stacking a pinning layer of an anti-ferromagnetic material, a pinned layer of ferromagnetic/non-magnetic metal/ferromagnetic layers, a tunneling barrier layer and a free layer of a magnetic material. Through the high or low magnetoresistance (MR) derived from magnetized directions of the pinned layer and the free layer being in parallel or anti-parallel, data of a logic state "0" or a logic state "1" are recorded.

As the CMOS technique keeps influencing advanced technology and in order to respond to high-density MRAM designs, a magnetic tunnel junction (MTJ) element of the MRAM also continues shrinking in its size. For the conventional asteroid mode and the toggle mode MTJ elements, when their sizes reduce, a switching field of the free layer in the MTJ elements continues to rise, and the operating margin reduces or even disappears. Therefore, how to enhance write selectivity and reduce write currents have always been the most notable obstacles developing magnetic memories has ever encountered.

The spin torque transfer random access memory (STT-RAM) is considered as the magnetic memory most likely to be applied in technology nodes beyond 65 nm. For the STT-RAM utilizing spin transfer switching as its write mode, since write currents only pass through those selected memory elements and magnetized switching depends upon write current density, shrinkage of elements is advantageous for reduction of write currents. In theory, enhancing write selectivity and reducing write currents can be achieved simultaneously.

A theoretical estimated value of a switching critical current density of the magnetic memory element utilizing spin transfer switching is $Jc=\alpha eM_s t[H_k+2\pi M_s]/h\eta$. $M_s$ is a saturation magnetization of a magnetic layer per unit volume; t is a thickness of the magnetic layer; $H_k$ is an anisotropic field; a is the Gilbert damping constant; η is a spin polarization factor, and h is the Boltzmann constant. The estimated value has not considered the effects of external electric fields and thermal dithering. It is known from the above formula that in research on the spin transmission effect, the factors influencing the switching current mainly are the foregoing physical quantities ($M_s$, $H_k$, α and η. Among them, the saturation magnetization ($M_s$) influences most significantly.

In U.S. Publication No. 2007/0159734 A1, an STT-RAM structure is proposed, which utilizes non-magnetic materials to perform doping in the free layer, e.g., Cr, Cu, Au, B, Nb, Mo, Ta, Pt, Pd, Rh, Ru, Ag, TaN, CuN and TaCuN, thereby reducing the saturation magnetization ($M_s$) of the free layer so as to lower the critical current density (Jc).

However, in order to continue enhancing the performance of the STT-RAM, how to reduce the critical current density and maintain sufficient thermal stability in the STT-RAM are still urgent issues to be resolved.

SUMMARY

The disclosure provides another magnetic memory element utilizing spin transfer switching. The magnetic memory element includes a pinned layer, a tunneling barrier layer, a free layer and a stabilizing layer. The tunneling barrier layer is disposed on the pinned layer. The free layer is disposed on the tunneling barrier layer. The stabilizing layer is disposed on the free layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
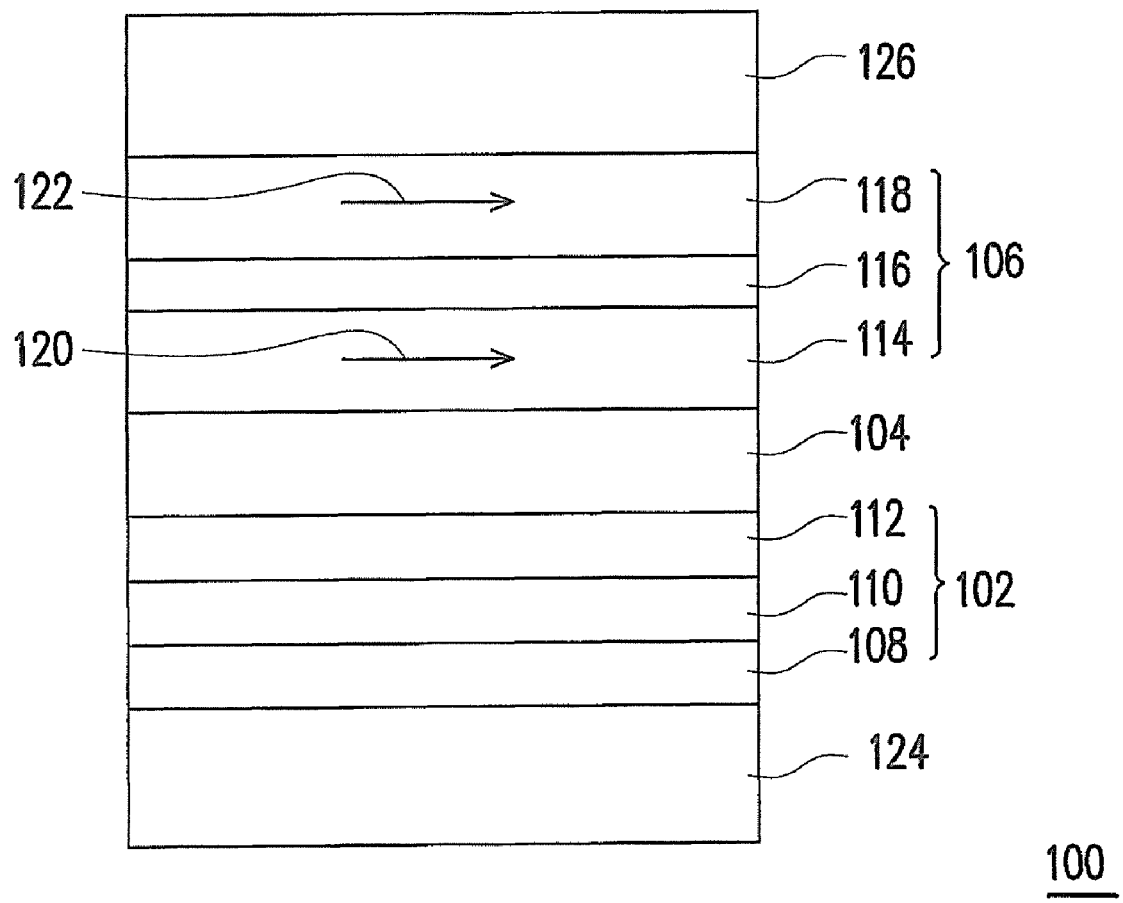
FIG. 1 is a schematic cross-sectional view of the magnetic memory element utilizing spin transfer switching according to the first embodiment of the disclosure.

FIG. 1 is a schematic cross-sectional view of the magnetic memory element utilizing spin transfer switching according to the first embodiment.

Referring to FIG. 1, a magnetic memory element 100 utilizing spin transfer switching includes a pinned layer 102, a tunneling barrier layer 104 and a free layer structure. According to the present embodiment, the free layer structure is, for example, a composite free layer 106.

The pinned layer 102 is a stacked layer of ferromagnetic/non-magnetic metal/ferromagnetic material constituted by a lower pinned layer 108, a coupling layer 110 and an upper pinned layer 112. Magnetization vectors of the lower pinned layer 108 and the upper pinned layer 112 are arranged as anti-parallel-coupled and not changed by operating magnetic fields. It should be noted that the pinned layer 102 depicted in FIG. 1 in the form of a multi-layered structure is provided for illustration purposes, and is not construed as limiting the scope of the disclosure. It is appreciated by persons skilled in the art that the pinned layer can be in the form of a single-layer structure.

The tunneling barrier layer 104 is disposed on the pinned layer 102. A material of the tunneling barrier layer 104 is magnesium oxide (MgO) or aluminum oxide (AlO), for example.

The composite free layer 106 includes a first free layer 114, an insert layer 116 and a second free layer 118. The first free layer 114 is disposed on the tunneling barrier layer 104 and has a first spin polarization factor and a first saturation magnetization. A material of the first free layer 114 is, for example, a magnetic material including a magnetic alloy of Fe, Ni, Co, and B, such as CoFeB, CoFe, Co or Fe. The insert layer 116 is disposed on the first free layer 114. A material of the insert layer 116 is a non-magnetic material, for example. The material may be a metal material or a non-metal material, e.g., Ta, Ru, Mg, Ti, Cu, Cr, Ag, Pt, Pd, Au, tantalum oxide (TaO), rudium oxide (RuO), MgO or titanium oxide (TiO). The second free layer 118 is disposed on the insert layer 116 and has a second spin polarization factor and a second saturation magnetization. A material of the second free layer 118 is, for example, a magnetic material, e.g., NiFe, Ni or CoFeB.

The first spin polarization factor is larger than the second spin polarization factor, the second saturation magnetization is smaller than the first saturation magnetization, and a magnetization vector 120 of the first free layer 114 and a magnetization vector 122 of the second free layer 118 are arranged as parallel-coupled.

In addition, the magnetization vector 120 of the first free layer 114 and the magnetization vector 122 of the second free layer 118 are arranged as parallel-coupled by an interlayer coupling through the insert layer 116. The interlayer coupling includes a long range coupling, e.g., the Ruderman-Kittel-Kasuya-Yosida (RKKY) coupling, and a short range coupling, e.g., a magnetostatic coupling.

Furthermore, a thickness of the insert layer 116 is, for example, a thickness which renders the magnetization vector 120 of the first free layer 114 and the magnetization vector 122 of the second free layer 118 to be parallel-coupled. For example, when the insert layer 116 has a certain thickness, the RKKY coupling effect can be used to arrange the magnetization vector 120 of the first free layer 114 and the magnetization vector 122 of the second free layer 118 as parallel-coupled to each other. Moreover, when the thickness of the insert layer 116 is of 1-6 angstroms or 12-18 angstroms, the magnetostatic coupling force can be used to arrange the magnetization vector 120 of the first free layer 114 and the magnetization vector 122 of the second free layer 118 as parallel-coupled.

Further, the magnetic memory element 100 utilizing spin transfer switching may optionally include a pinning layer 124. The pinned layer 102 can be disposed on the pinning layer 124. A material of the pinning layer 124 is an anti-ferromagnetic material, for example.

On the other hand, the magnetic memory element 100 utilizing spin transfer switching may further include a capping layer 126. The capping layer 126 is disposed on the composite free layer 106 and can be used for protecting the composite free layer 106. A material of the capping layer 126 is Ta, Ti, Ru, $AlO_x$ or MgO, for example.

Certainly, the magnetic memory element 100 utilizing spin transfer switching may further include a conductive line (not shown) electrically connected to the capping layer 126 and a conductive line (not shown) electrically connected to the pinning layer 124 so as to operate the magnetic memory element 100 utilizing spin transfer switching. A method of operating the magnetic memory element 100 utilizing spin transfer switching is well-known to people having ordinary skill in the art and therefore is not repeated herein.

It is known from the above embodiment that in the composite free layer 106 of the magnetic memory element 100 utilizing spin transfer switching, since the first spin polarization factor of the first free layer 114 is larger than the second spin polarization factor of the second free layer 118, the first free layer 114 can provide a high spin polarization factor to obtain a high magnetoresistance ratio (MR %) so that the reading signals are enhanced and the critical current density (Jc) is lowered effectively. Additionally, the second saturation magnetization of the second free layer 118 is smaller than the first saturation magnetization of the first free layer 114, and therefore the second free layer 118 can assist the magnetization reversal of the first free layer 114 through the interlayer coupling and thus minimize the critical current density. And a higher first saturation magnetization of the first free layer 114 is provided to maintain the sufficient thermal stability of the magnetic memory element.

It should be noted that the composite free layer 106 in the foregoing embodiment may also be applied to a magnetic memory element utilizing spin transfer switching whose free layer structure is a synthetic anti-ferromagnetic free layer. A magnetic memory element utilizing spin transfer switching whose free layer structure is a synthetic anti-ferromagnetic free layer is exemplified by the second embodiment and the third embodiment for illustration in the following.

Figure 2:
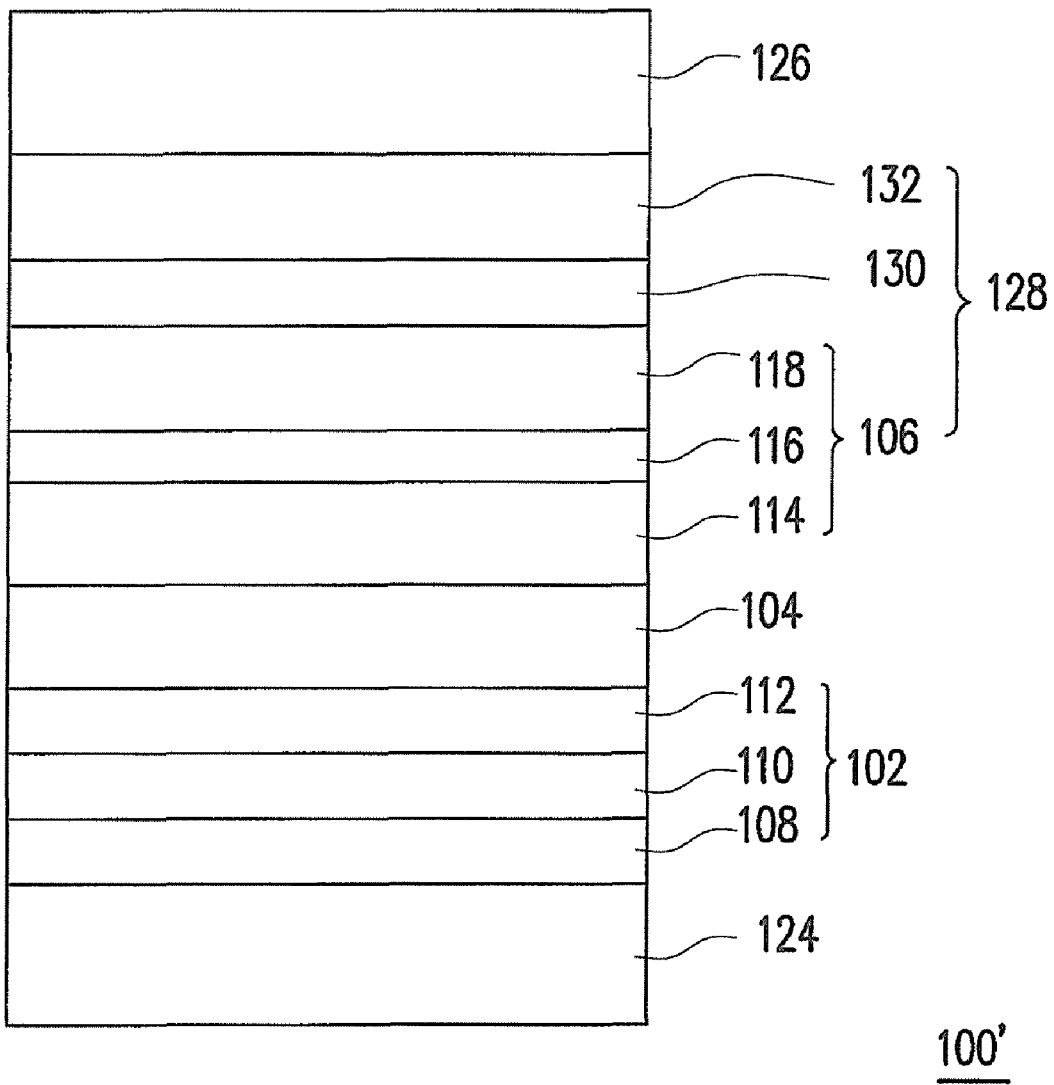
FIG. 2 is a schematic cross-sectional view of the magnetic memory element utilizing spin transfer switching according to the second embodiment of the disclosure.
Figure 3:
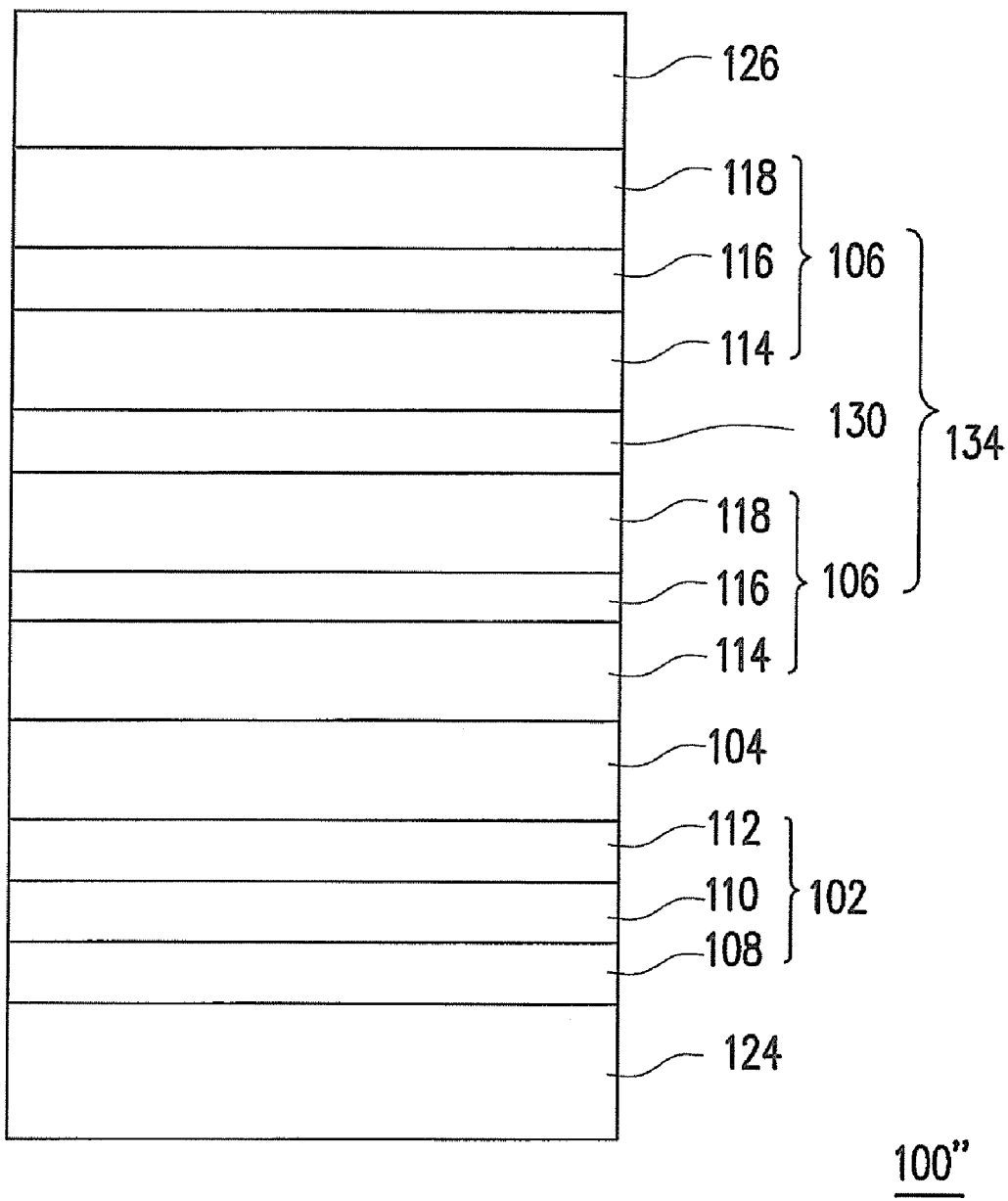
FIG. 3 is a schematic cross-sectional view of the magnetic memory element utilizing spin transfer switching according to the third embodiment of the disclosure.

FIG. 2 is a schematic cross-sectional view of the magnetic memory element utilizing spin transfer switching according to the second embodiment. FIG. 3 is a schematic cross-sectional view of the magnetic memory element utilizing spin transfer switching according to the third embodiment. The elements in FIGS. 2 and 3 which are the same as those appear in FIG. 1 use the same reference numerals, and a description of said elements is not repeated herein.

Referring to both FIGS. 1 and 2, the difference between the second embodiment and the first embodiment lies in that a free layer structure 128 of a magnetic memory element 100' utilizing spin transfer switching of the second embodiment further includes a first spacer layer 130 and a third free layer 132 besides the composite free layer 106. The first spacer layer 130 is disposed on the composite free layer 106, and a material of the first spacer layer 130 is Ru, Cr or Cu, for example. The third free layer 132 is disposed on the first spacer layer 130. A material of the third free layer 132 is a magnetic material, for example. A magnetization vector of the composite free layer 106 and a magnetization vector of the third free layer 132 are arranged as anti-parallel-coupled. In addition, materials and efficacies of the other components in the magnetic memory element 100' utilizing spin transfer switching of the second embodiment are generally the same as those in the magnetic memory element 100 utilizing spin transfer switching of the first embodiment, and therefore are not repeated herein.

Referring to both FIGS. 2 and 3, the difference between the second embodiment and the third embodiment lies in that in a magnetic memory element 100" utilizing spin transfer switching of the third embodiment, the third free layer in a free layer structure 134 is also the composite free layer 106. In other words, the free layer structure 134 in the magnetic memory element 100" utilizing spin transfer switching includes from bottom upwards the tunneling barrier layer 104, the composite free layer 106, the first spacer layer 130 and the composite free layer 106. Herein, magnetization vectors of the two composite free layers 106 disposed over and under the first spacer layer 130 are arranged as anti-parallel to each other. Moreover, materials and efficacies of the other components in the magnetic memory element 100" utilizing spin transfer switching of the third embodiment are generally the same as those in the magnetic memory element 100' utilizing spin transfer switching of the second embodiment, and therefore are not repeated herein.

Figure 4:
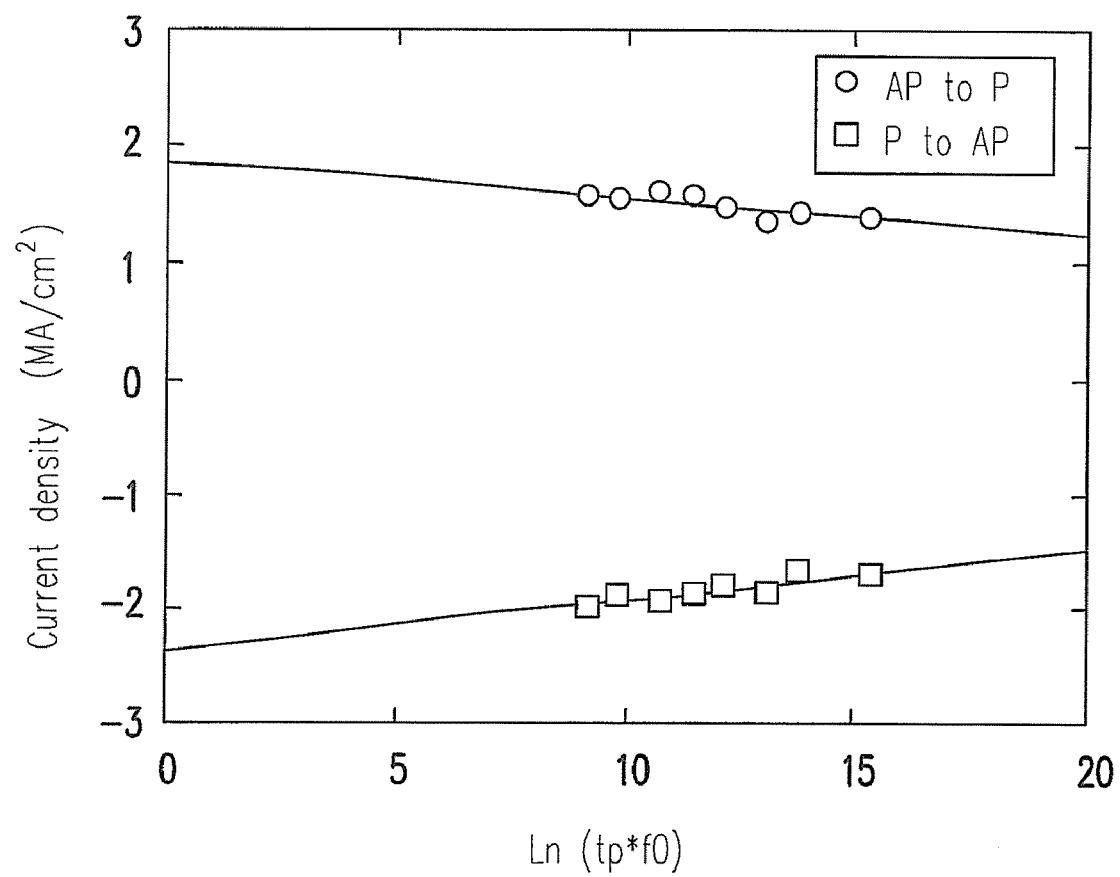
FIG. 4 is a curve diagram showing experiment results from a magnetic memory element utilizing spin transfer switching according to an experiment of the disclosure.

FIG. 4 is a curve diagram showing experiment results from the magnetic memory element utilizing spin transfer switching according to an experiment of the disclosure.

In the magnetic memory element utilizing spin transfer switching of the experiment, a material of the first free layer is CoFeB; a material of the second free layer is NiFe; a material of the insert layer is Ta and has a very thin thickness (3 angstroms), and a material of the tunneling barrier layer is MgO. FIG. 4 shows a switching current density (Jc) under different write current pulses. A critial current density ($J_{C0}$) writing from an anti-parallel high resistance (AP) to a parallel low resistance (P) obtained by extrapolation is about $1.8 \times 10^6$ A/cm$^2$, and a critical current density ($J_{C0}$) writing from a parallel low resistance (P) to an anti-parallel high resistance (AP) is about $2.3 \times 10^6$ A/cm$^2$. Besides, a thermal stability (EB) from an anti-parallel high resistance (AP) to a parallel low resistance (P) obtained via a slope is about 57 $K_bT$, and a thermal stability (EB) from a parallel low resistance (P) to an anti-parallel high resistance (AP) is about 53 $K_bT$.

Figure 5:
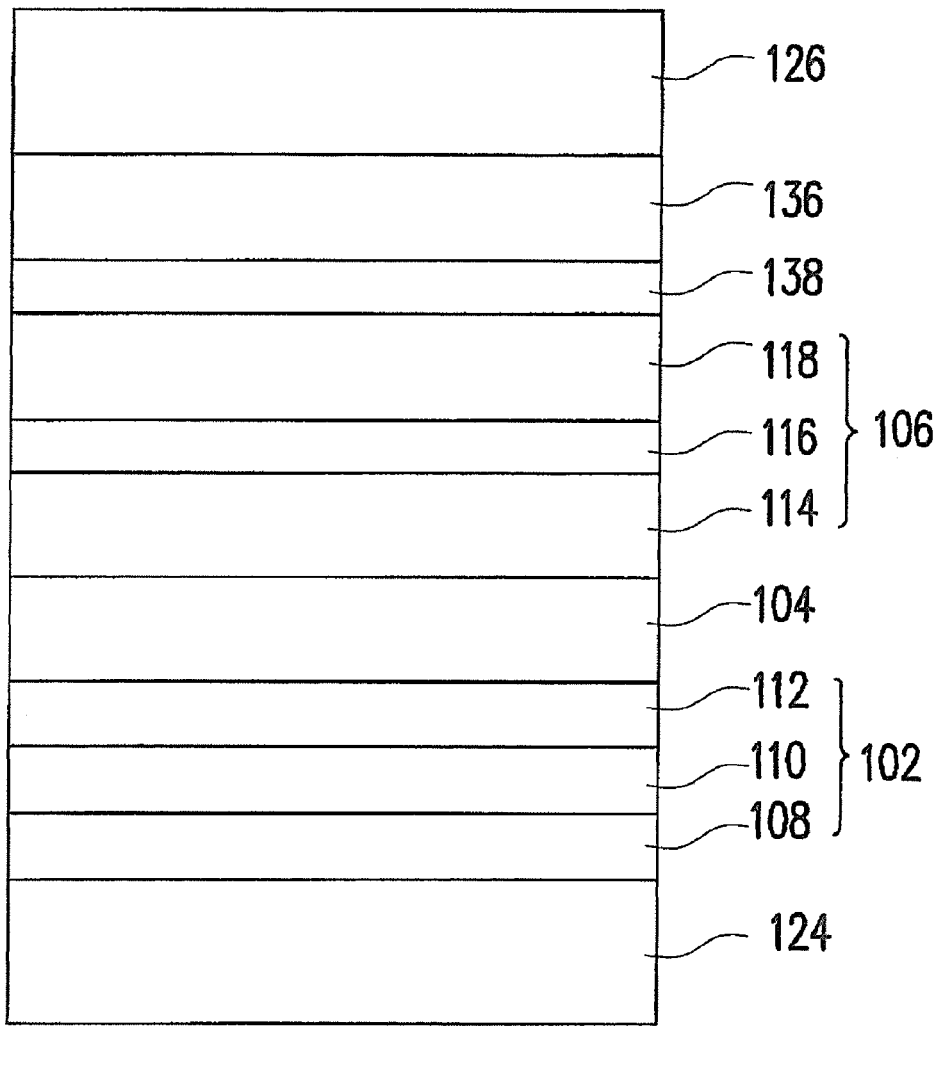
FIG. 5 is a schematic cross-sectional view of the magnetic memory element utilizing spin transfer switching according to the fourth embodiment of the disclosure.
Figure 6:
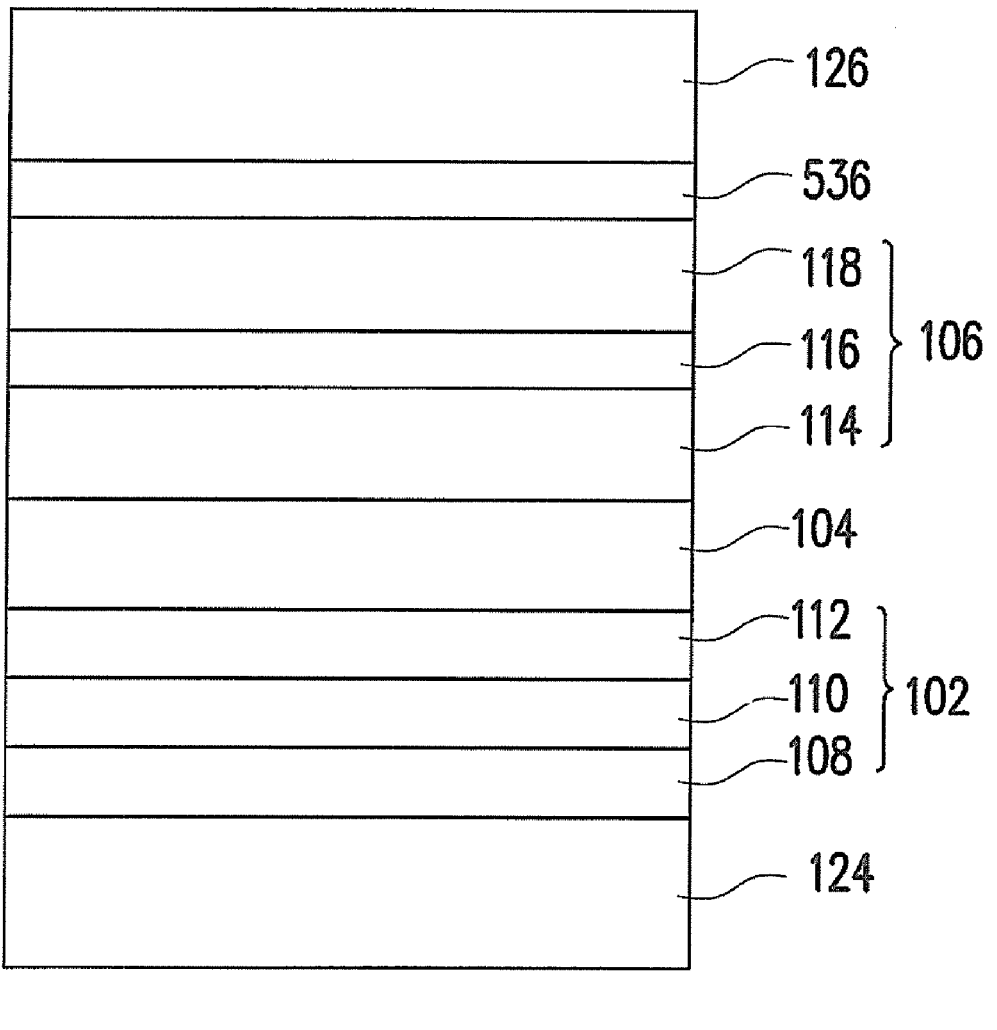
FIG. 6 is a schematic cross-sectional view of the magnetic memory element utilizing spin transfer switching according to the fifth embodiment of the disclosure.

FIG. 5 is a schematic cross-sectional view of the magnetic memory element utilizing spin transfer switching according to the fourth embodiment. FIG. 6 is a schematic cross-sectional view of the magnetic memory element utilizing spin transfer switching according to the fifth embodiment. The elements shown in FIGS. 5 and 6 which are identical to those appear in FIG. 1 are designated with the same reference numerals, and a description of said elements is not repeated hereinafter.

Referring to FIGS. 1 and 5 concurrently, the difference between the fourth embodiment and the first embodiment lies in that a magnetic memory element 400 utilizing spin transfer switching of the fourth embodiment further includes a stabilizing layer 136 and a second spacer layer 138. The stabilizing layer 136 is disposed on the free layer structure, and is located between the composite free layer 106 and the capping layer 126. A material of the stabilizing layer 136 is, for example, an anti-ferromagnetic material which may be PtMn, IrMn, or FeMn with a thickness of greater 50 angstroms. The second spacer layer 138 is disposed between the free layer structure and the stabilizing layer 136. A material of the second spacer layer 138 may be a metal material with a spin diffusion length greater than 100 angstroms, such as Ru, Ta, Ti, Cu, Au, Ag, Al, Pt or Pd. In addition, materials and efficacies of the other components in the magnetic memory element 400 utilizing spin transfer switching of the fourth embodiment are generally the same as those in the magnetic memory element 100 utilizing spin transfer switching of the first embodiment, and therefore are not repeated herein.

The stabilizing layer 136 provides an anisotropy to the free layer structure without a significant exchange bias by means of adjusting the material and the thickness.

Accordingly, the anisotropy provided by the stabilizing layer 136 can increase the coercivity of the free layer structure 106 to enhance the thermal stability. Furthermore, the stabilizing layer 136 may provide an additional out-of-plane anisotropy and thereby reduce the required switching current. The interfacial uncompensated moments of the stabilizing layer 136 which are coupled to and preferring aligned in parallel to the magnetization of the free layer structure 106, can also reduce the required switching current by reflecting the spin current to enhance the effectively spin transfer torque accordingly. In view of the above, the magnetic memory element 400 utilizing spin transfer switching can effectively reduce the critical current density and improve thermal stability.

Referring to FIGS. 5 and 6 concurrently, the difference between the fifth embodiment and the fourth embodiment lies in that the second spacer layer 138 presented in the magnetic memory element 400 utilizing spin transfer switching of the fourth embodiment is absent in a magnetic memory element 500 utilizing spin transfer switching of the fifth embodiment. Thus, in the magnetic memory element 500 utilizing spin transfer switching of the fifth embodiment, a stabilizing layer 536 is disposed on the composite free layer 106, and directly contacts the second free layer 118. A thickness of the stabilizing layer 536 can be within a range of 10 angstroms to 50 angstroms. Besides, materials and efficacies of the other components in the magnetic memory element 500 utilizing spin transfer switching of the fifth embodiment are generally the same as those in the magnetic memory element 400 utilizing spin transfer switching of the fourth embodiment, and therefore are not repeated herein.

The stabilizing layer 536 provides an anisotropy to the free layer structure 106 without a significant exchange bias by means of adjusting the material and the thickness. Accordingly, the anisotropy provided by the stabilizing layer 536 can increase the coercivity of the free layer structure 106 to enhance the thermal stability. Furthermore, the stabilizing layer 536 may provide an additional out-of-plane anisotropy and thereby reduce the required switching current. The interfacial uncompensated moments of the stabilizing layer 536 which are coupled to and preferring aligned in parallel to the magnetization of the free layer structure 106, can also reduce the required switching current by reflecting the spin current to enhance the effectively spin transfer torque accordingly. Hence, the magnetic memory element 500 utilizing spin transfer switching can effectively reduce the critical current density and improve thermal stability.

Figure 7:
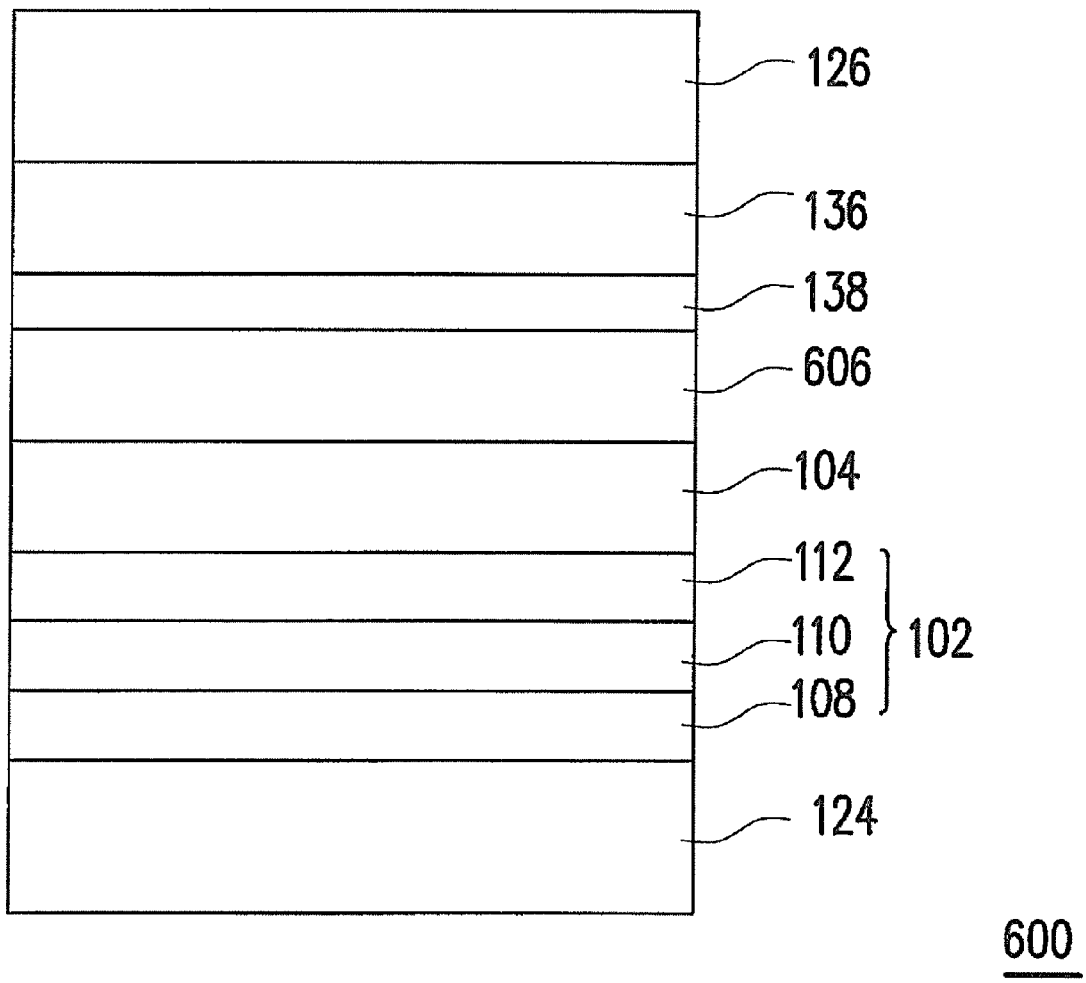
FIG. 7 is a schematic cross-sectional view of the magnetic memory element utilizing spin transfer switching according to the sixth embodiment of the disclosure.
Figure 8:
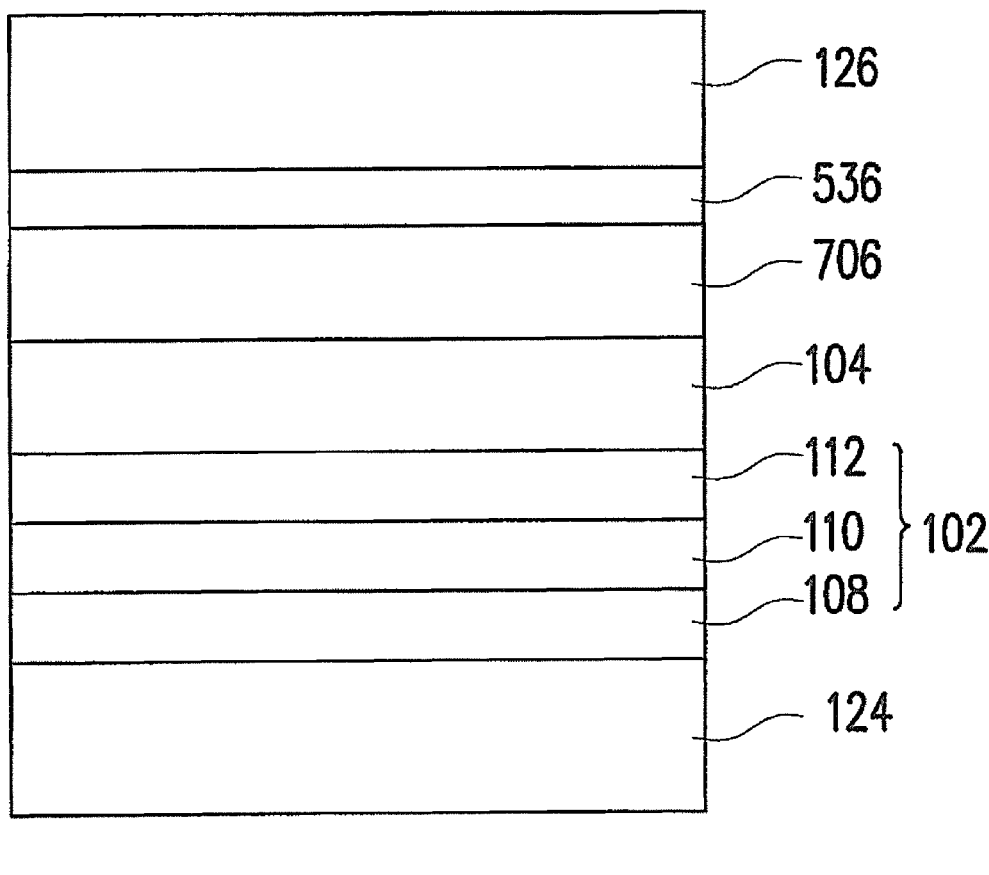
FIG. 8 is a schematic cross-sectional view of the magnetic memory element utilizing spin transfer switching according to the seventh embodiment of the disclosure.

FIG. 7 is a schematic cross-sectional view of the magnetic memory element utilizing spin transfer switching according to the sixth embodiment. FIG. 8 is a schematic cross-sectional view of the magnetic memory element utilizing spin transfer switching according to the seventh embodiment. The elements shown in FIGS. 7 and 8 which are identical to those appear in FIGS. 5 and 6 are designated with the same reference numerals, and a description of said elements is not repeated hereinafter.

Referring to FIGS. 5 and 7 concurrently, the difference between the sixth embodiment and the fourth embodiment lies in that a free layer 606 in a magnetic memory element 600 utilizing spin transfer switching of the sixth embodiment is in the of a single-layered structure and the composite free layer 106 in the magnetic memory element 400 utilizing spin transfer switching of the fourth embodiment is in the form of a multi-layered composite structure. A material of the free layer 606 may be a magnetic material including a magnetic alloy of Fe, Ni, Co, and B, such as CoFeB, CoFe, NiFe, Ni, Co or Fe. In addition, materials and efficacies of the other components in the magnetic memory element 600 utilizing spin transfer switching of the sixth embodiment are generally the same as those in the magnetic memory element 400 utilizing spin transfer switching of the fourth embodiment, and therefore are not repeated herein.

Likewise, the stabilizing layer 136 provides an anisotropy to the free layer 606 without a significant exchange bias by means of adjusting the material and the thickness.

Accordingly, the anisotropy provided by the stabilizing layer 136 can increase the coercivity of the free layer 606 to enhance the thermal stability. Furthermore, the stabilizing layer 136 may provide an additional out-of-plane anisotropy and thereby reduce the required switching current. The interfacial uncompensated moments of the stabilizing layer 136 which are coupled to and preferring aligned in parallel to the magnetization of the free layer 606, can also reduce the required switching current by reflecting the spin current to enhance the effectively spin transfer torque accordingly. Based on the foregoing, the magnetic memory element 600 utilizing spin transfer switching can effectively reduce the critical current density and improve thermal stability.

Referring to FIGS. 6 and 8 concurrently, the difference between the seventh embodiment and the fifth embodiment lies in that a free layer 706 in a magnetic memory element 700 utilizing spin transfer switching of the seventh embodiment is in the of a single-layered structure and the composite free layer 106 in the magnetic memory element 500 utilizing spin transfer switching of the fifth embodiment is in the form of a multi-layered composite structure. A material of the free layer 706 may be a magnetic material including a magnetic alloy of Fe, Ni, Co, and B, such as CoFeB, CoFe, NiFe, Ni, Co or Fe. Besides, materials and efficacies of the other components in the magnetic memory element 700 utilizing spin transfer switching of the seventh embodiment are generally the same as those in the magnetic memory element 500 utilizing spin transfer switching of the fifth embodiment, and therefore are not repeated herein.

Similarly, the stabilizing layer 536 provides an anisotropy to the free layer 706 without a significant exchange bias by means of adjusting the material and the thickness. Accordingly, the anisotropy provided by the stabilizing layer 536 can increase the coercivity of the free layer 706 to enhance the thermal stability. Furthermore, the stabilizing layer 536 may provide an additional out-of-plane anisotropy and thereby reduce the required switching current. The interfacial uncompensated moments of the stabilizing layer 536 which are coupled to and preferring aligned in parallel to the magnetization of the free layer 706, can also reduce the required switching current by reflecting the spin current to enhance the effectively spin transfer torque accordingly. Consequently, the reduction of the critical current density and the improvement of thermal stability can be achieved effectively in the magnetic memory element 700 utilizing spin transfer switching.

In summary, the above embodiments have at least one of the following advantages:

The critical current density is effectively reduced by the magnetic memory elements utilizing spin transfer switching described in the foregoing embodiments.

The magnetic memory elements utilizing spin transfer switching of the foregoing embodiments have sufficient thermal stability.

The magnetic memory elements utilizing spin transfer switching of the foregoing embodiments have sufficient reading signals.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A magnetic memory element utilizing spin transfer switching, comprising:
   a pinned layer;
   a tunneling barrier layer, disposed on the pinned layer;
   a free layer, disposed on the tunneling barrier layer;
   a stabilizing layer, disposed on the free layer; and
   a spacer layer, disposed between the free layer and the stabilizing layer, wherein the spacer layer is in direct contact with the free layer and the stabilizing layer.

2. The magnetic memory element utilizing spin transfer switching as claimed in claim 1, wherein a material of the tunneling barrier layer comprises magnesium oxide (MgO) or aluminum oxide.

3. The magnetic memory element utilizing spin transfer switching as claimed in claim 1, wherein a material of the free layer comprises a magnetic material.

4. The magnetic memory element utilizing spin transfer switching as claimed in claim 1, wherein a material of the stabilizing layer comprises an anti-ferromagnetic material.

5. The magnetic memory element utilizing spin transfer switching as claimed in claim 1, further comprising a pinning layer, wherein the pinned layer is disposed on the pinning layer.

6. The magnetic memory element utilizing spin transfer switching as claimed in claim 5, wherein a material of the pinning layer comprises an anti-ferromagnetic material.

7. The magnetic memory element utilizing spin transfer switching as claimed in claim 1, further comprising a capping layer disposed on the stabilizing layer.

8. The magnetic memory element utilizing spin transfer switching as claimed in claim 7, wherein a material of the capping layer is Ta, Ti, Ru, $AlO_x$ or MgO.

9. The magnetic memory element utilizing spin transfer switching as claimed in claim 1, wherein the stabilizing layer has a thickness within a range of 10 angstroms to 50 angstroms.

10. The magnetic memory element utilizing spin transfer switching as claimed in claim 1, wherein a material of the spacer layer comprises a metal with a spin diffusion length greater than 100 angstroms.

11. The magnetic memory element utilizing spin transfer switching as claimed in claim 10, wherein the stabilizing layer has a thickness greater than 50 angstroms.

12. The magnetic memory element utilizing spin transfer switching as claimed in claim 10, wherein the metal is Ru, Ta, Ti, Cu, Au, Ag, Al, Pt or Pd.

* * * * *